US005926493A

United States Patent [19]

O'Brien et al.

[11] Patent Number: 5,926,493

[45] Date of Patent: Jul. 20, 1999

[54] OPTICAL SEMICONDUCTOR DEVICE WITH DIFFRACTION GRATING STRUCTURE

[75] Inventors: Stephen O'Brien, Sunnyvale; Hanmin Zhao, Milpitas; Jo S. Major, Jr., San Jose, all of Calif.

[73] Assignee: SDL, Inc., San Jose, Calif.

[21] Appl. No.: 08/859,416

[22] Filed: May 20, 1997

[51] Int. Cl.[6] .................... H01S 3/19; G02B 6/34

[52] U.S. Cl. .................... 372/45; 372/96; 385/37; 385/131

[58] Field of Search .................... 372/96, 45, 102; 385/14, 37, 131

[56] References Cited

U.S. PATENT DOCUMENTS

| | | | |
|---|---|---|---|
| 4,786,951 | 11/1988 | Tokuda et al. | 357/17 |
| 4,815,087 | 3/1989 | Hayashi | 372/45 |
| 5,208,824 | 5/1993 | Tsang | 372/96 |
| 5,347,533 | 9/1994 | Higashi et al | 372/96 |
| 5,416,866 | 5/1995 | Sahlen | 385/37 |
| 5,619,523 | 4/1997 | Connolly et al. | 372/96 |
| 5,727,015 | 3/1998 | Takhashi et al. | 372/96 |

OTHER PUBLICATIONS

P. K. York et al., "MOCVD Regrowth over GaAs/AlGaAs Gratings for High Power Long–Lived InGaAs/AlGaAs Lasers", *Journal of Crystal Growth*, vol. 124, pp. 709–715, (1992) (No Month).

*Primary Examiner*—James W. Davie
*Attorney, Agent, or Firm*—W. Douglas Carothers, Jr.

[57] ABSTRACT

Optical semiconductor devices with integrated diffraction gratings with higher quality are realized through the use of Al-free grating layers. AlGaAs/GaAs regime optical semiconductor devices, such as laser diodes or optical filters, conventionally utilize an AlGaAs grating layer that has a strong affinity for oxidation. Instead of a Al-containing layer, a quantenary, InGaAsP grating layer is utilized, lattice matched to the underlying AlGaAs/GaAs structure, substantially eliminating any problem of oxide contamination. Also, an Al-free, ternary InGaP grating layer is utilized in the InGaP/InGaAsP/GaAs material regime. The quantum well active region of these devices may also be modified to extend the gain bandwidth of operation of these devices to insure continued operation over a wider temperature range with the wavelength peak of the grating in that the wavelength peak of the grating more assuredly remains within the wavelength operating range of the device.

26 Claims, 3 Drawing Sheets

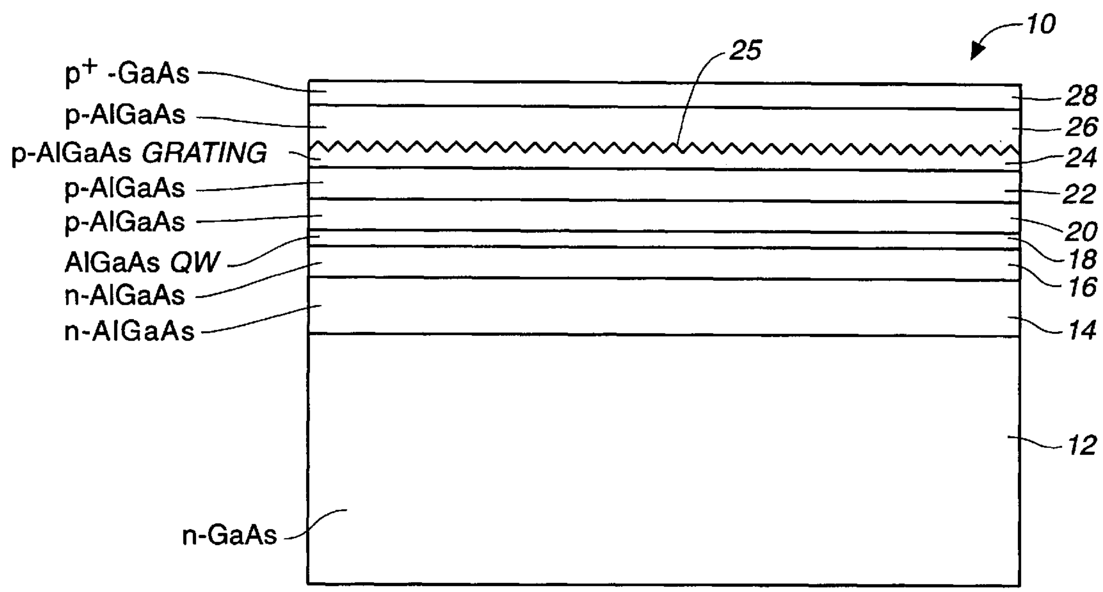
FIG._1
(PRIOR ART)
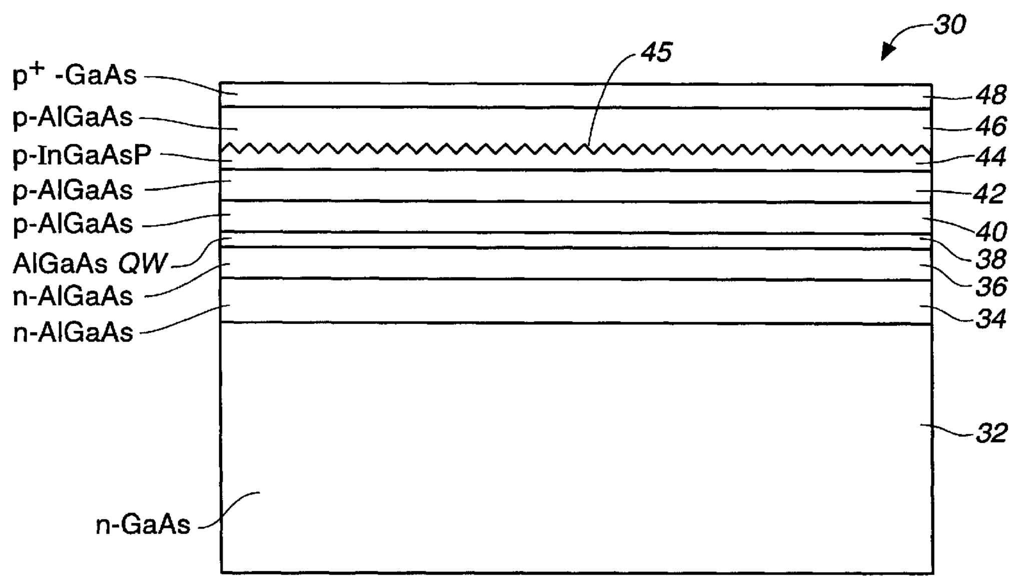
FIG._2

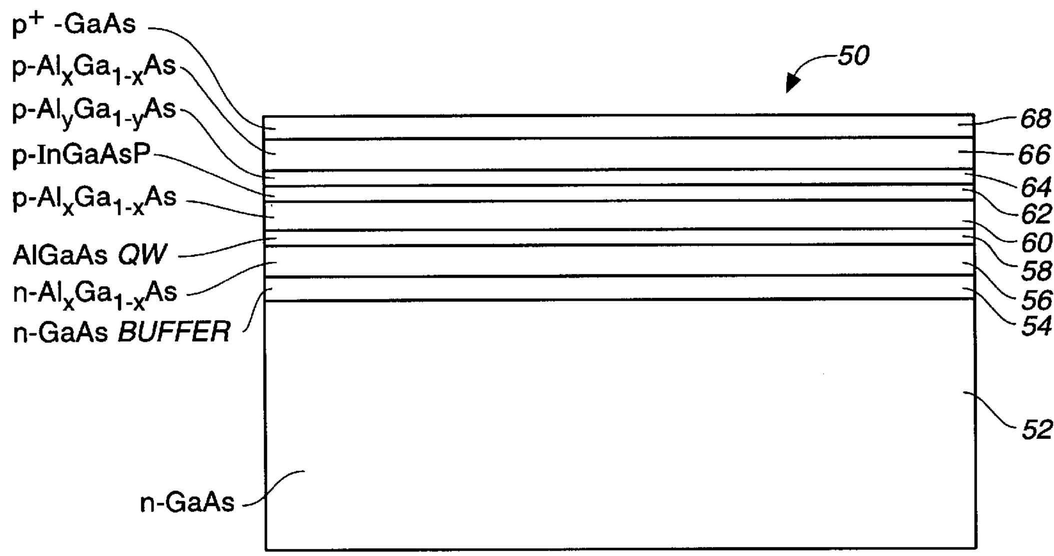
FIG._3
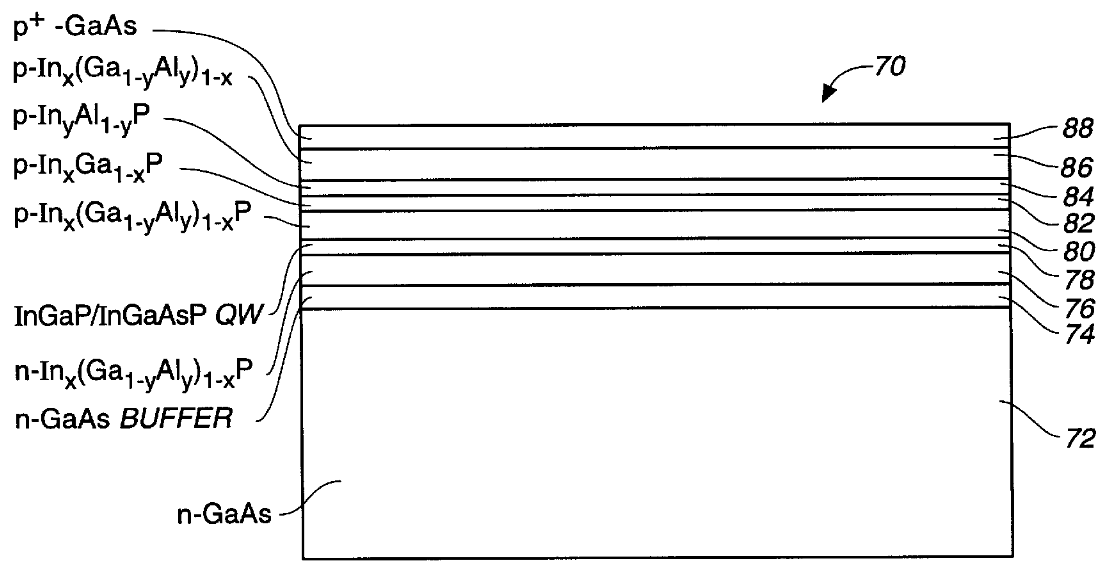
FIG._4

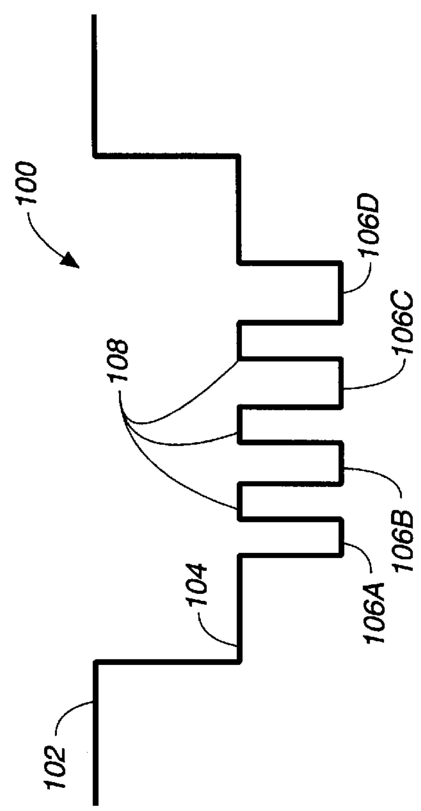
FIG._6
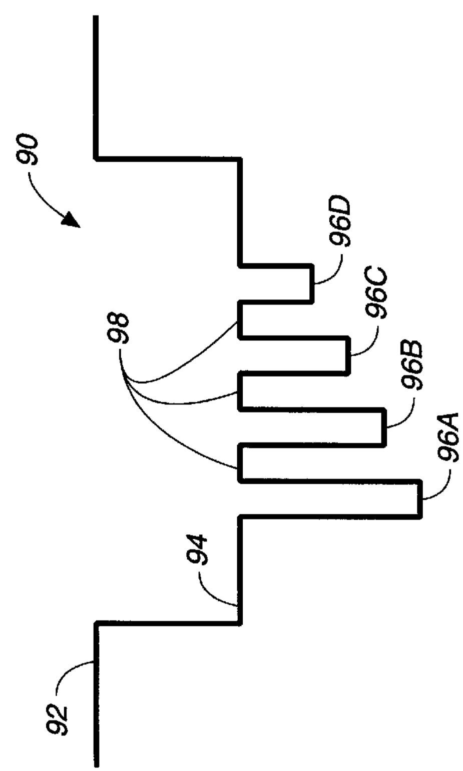
FIG._5

OPTICAL SEMICONDUCTOR DEVICE WITH DIFFRACTION GRATING STRUCTURE

FIELD OF THE INVENTION

This invention relates generally to optical semiconductor devices and, more particularly, to optical semiconductor devices, such as optical waveguides, optical semiconductor amplifiers or lasers, that have a periodic or chirped layer structure functioning as an optical diffraction grating with a periodical or chirped variation (or combination thereof) in refractive index in the direction of propagating light in the device affecting the wavelength of the light. Such gratings, functioning as zero or first order diffraction gratings, are commonly found in distributed feedback (DFB) lasers, surface emitting lasers, Distributed Bragg Reflector (DBR) lasers, wavelength tunable amplifiers, optical filters, detectors, optical switch matrixes and optical modulators.

Distributed feedback (DFB) lasers, distributed Bragg reflection (DBR) lasers and wavelength tunable optical filters have great advantage in optical fiber communications because of their ability to generate very narrow band emission at a desired wavelength and to provide optical switching and multiplexing in telecommunications. These lasers and filters include an integrated buried diffraction grating for providing a fixed oscillation wavelength. The buried grating in these devices functions as a selective mirror on propagating radiation so that the laser diode oscillates with a wavelength wherein radiation reflected by the periodic grooves or edges of the grating are in phase, limiting the diode to oscillate at a fixed oscillation wavelength. However, these lasers are more costly to manufacture particularly because of required regrowth techniques necessary after forming the buried grating to commence regrowth of the remaining portion of laser diode structure.

DBR lasers to achieve wavelength emissions between about 760 nm and 1100 nm use the AlGaAs/GaAs material regime to achieve emission of wavelengths within this band. Wavelength emissions between about 1300 nm and 1600 nm can be achieved using the InGaAsP/InP material regime. In AlGaAs/GaAs waveguide laser diodes, regrowth on AlGaAs typically include a regrowth performed on a AlGaAs grating layer. FIG. 1 shows a conventional separate confinement heterostructure (SCH) DFB laser diode device of the AlGaAs/GaAs regime with a grating layer 24 spaced from active region 18 and operative within the above mentioned wavelength range, particularly around 810 nm. DFB laser diode 10 comprises a substrate of n-GaAs upon which is consecutively deposited a waveguide layer 14 of n-AlGaAs, a cladding layer 16 of n-AlGaAs, an active region 18 comprising GaAs, or multiple quantum wells of GaAs separated by AlGaAs barriers, or quantum wells of AlGaAs separated by barrier of AlGaAs, a cladding layer 20 of p-AlGaAs, a spacer layer 22 of p-AlGaAs, a grating layer 24 of P-AlGaAs having an etched corrugated grating 25 (achieved by conventional photolithography and etch processing), and a continued regrowth comprising a waveguide layer 26 of p-AlGaAs and a cap layer 28 of $p^+$-GaAs. Device 10 is grown by conventional MOCVD and the first MOCVD growth process is accomplished for layers beginning with waveguide layer 14 up to and including grating layer 24. After selective etching of grating layer 24 to form grating 25, a second MOCVD growth process is initiated on formed grating 25 with continued growth of cladding layer 26 growth is finalized with cap layer 28. Since GaAs is highly absorptive at 810 nm, grating layer 24 must be composed of AlGaAs which is transparent to this wavelength. For a laser diode operative at 810 nm, an Al mole fraction of at least 15% in AlGaAs, e.g., $Al_{0.2}Ga_{0.8}As$, is required in grating layer 24 to achieve such transparency and, therefore, high efficient laser operation.

Regrowth on AlGaAs is difficult, however, due to the interim formation of a strong oxide, $Al_xGa_{1-x}AsO_y$ which forms on the grating surface. Regrowth quality in cases of small quantities of Al, i.e., where x is very small, may not be a problem, but to achieve all possible wavelengths within the largest possible bandwidth of wavelengths, the oxide results in contamination and poorer regrowths over the AlGaAs grating layer. This is explained in the article of P. K. York et al. entitled, "MOCVD Regrowth Over GaAs/AlGaAs Gratings for High Power Long-Lived InGaAs/AlGaAs Lasers", *Journal of Crystal Growth,* Vol. 124, pp. 09–715 (1992), regrowth over exposed regions of $Al_xGa_{1-x}As$ particularly for values where $x \geqq 0.4$, is rendered difficult due to strong oxidation due to the reactivity of Al-containing compounds as well as poor nucleation over oxidized AlGaAs. York et al addresses this contamination problem upon regrowth over the grating layer by employing a GaAs wire grating with exposure of the underlying $Al_xGa_{1-x}As$ spacer layer, $x \geqq 0.4$, which inhibited mass transport of the Ga and As molecules of the grating layer and its ultimate redistribution during the second growth process. However, some contamination is still inevitable since the underlying Al layer is necessarily exposed to some extent. What is need is a grating layer that can be lattice matched to GaAs without any need for consideration of underlayer spacer layer exposure or to tend with any problem of grating layer mass transport.

It is an object of this invention to provide an optical semiconductor device with a diffraction grating layer of improved quality and performance.

It is a further object of this invention to prevent any significant contamination during regrowth performance after formation of a diffraction grating, such as oxide contamination.

It is another object of this invention to broaden the gain bandwidth of tunable wavelengths for optical semiconductor devices.

It is a further specific object of this invention to produce a DBR or DFB laser structure operating at about 810 nm which achieves good performance through replacement of Al-containing diffraction grating layers with an Al-free diffraction grating layer, e.g., InGaAsP, providing for lower defects, in combination with a modified QW active region in the structure that provides for wider gain bandwidth.

SUMMARY OF THE INVENTION

According to this invention, improved regrowth without oxide contamination is achieved by replacing a grating layer that has a high affinity for contamination, particularly for oxidation, with a layer that has no such affinity and is lattice matched to the underlying semiconductor layers. Regrowth in fabrication of DBR or DFB lasers operating, for example, at 810 nm, can operate with increased performance if the Al content in the grating layer due to decreasing material absorption. However, the general morphology and crystallinity of the regrown layers employing high Al content suffer leading to a large disparity in output performance between non-regrown and regrown device structures. Thus, regrowth suffers due to the high Al content in the grating layer. With transition to Al-free grating layers with appropriate bandgap can circumvent this performance problem.

Thus, this invention relates to the replacement of a Al-containing diffraction grating layer, e.g., AlGaAs grating layer, with a Al-free diffraction grating layer, i.e., with a quantenary, InGaAsP grating layer in the AlGaAs/GaAs material regime or with a ternary InGaP grating layer in the InGaP/InGaAsP/GaAs material regime without experiencing any oxide contamination affecting material quality of second growth layers deposited above the formed grating layer. The device design with the use of an InGaAsP grating layer allows for high quality regrowth of AlGaAs layers for producing highly reliable 1.3 $\mu$m and 1.5 mm telecommunication lasers while enabling use of a well characterized, high performance AlGaAs laser structure permitting the pursuit of quality devices having shorter wavelengths, such as 808 nm or 810 nm. Thus, we have discovered that very high quality regrowths of AlGaAs are possible on InGaAsP because no strong oxides are form on the InGaAsP or InGaP grating layer. After formation of the periodic grating, InGaAsP layer, second or continued growth of either AlGaAs or InAlP, as the case may be, may be employed to provide for fill-in of the formed grating layer. The high quality regrowths using InGaAsP or InGaP permits quantum well characterization employing high performance AlGaAs/GaAs or InGaP/InGaAsP well structures. In the particular case for $In_xGa_{1-x}As_yP_{1-y}$ compound, x and y are adjusted to provide a lattice-matched condition to the host substrate, GaAs, for example, and a bandgap energy that provides full transparency at the desired wavelength. e.g., 810 nm, within a desired temperature range, such as −50° C. to +75° C. with greater than 300 W QCW output (arrays). Thus, temperature insensitive laser diodes and laser diode arrays operating at around 810 nm experience only about a 7.5 nm change in peak wavelength and only about 20% variation in output power at constant drive current over an ambient temperature range of about 50° C. to +75° C. State-of-the-art devices experience about 35 nm change over approximately the same temperature range.

The quantum well active region of these laser devices with Al-free diffraction grating layers may be modified to extend the gain bandwidth of operation of theses device to insure continued operation over a wider temperature range of operation in that the wavelength peak of the grating more assuredly remains within the wavelength operating range of the device.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a schematic cross-sectional view of a DFB laser diode known in the prior art.

FIG. 2 is a schematic cross-sectional view of a DFB laser diode comprising a first embodiment of this invention.

FIG. 3 is schematic cross-sectional view of a DFB laser diode comprising another form of the embodiment shown in FIG. 2.

FIG. 4 is a schematic cross-sectional view of a DFB laser diode comprising a second embodiment of this invention.

FIG. 5 is an energy band diagram of a multiple quantum well (MQW) active region with wells of different composition according to a further aspect of this invention.

FIG. 6 is an energy band diagram of a multiple quantum well (MQW) active region with wells of different widths according to a further aspect of this invention.

PREFERRED EMBODIMENTS OF THE INVENTION

While the examples of the following embodiments relate to DFB laser diodes, it will be understood by those in the art that the grating layers disclosed can be utilized in other optical devices, such as wavelength tunable filters of the type, for example, disclosed in U.S. Pat. No. 5,416,866 and other such devices mentioned therein. Moreover, discussion here is limited to periodic gratings having a constant grating period. However, as is known in the art, the optical semiconductor devices may have two or more diffraction gratings with different grating periods or that grating period can be a chirped grating having a varied grating period at least for a portion of the grating structure.

Reference is now made to FIG. 2 which discloses a general embodiment of this invention. Optical semiconductor device 30 is a DFB laser diode having a corrugated grating layer 44 comprising InGaAsP. The difficulties with regrowth on AlGaAs grating layers, such as grating layer 24 in FIG. 1, can be circumvented with the use of Al-free grating layers such as InGaAsP or InGaP. These phosphide-containing grating layers are lattice-matched to GaAs with an alloy composition adjusted so the energy gap of grating layer 24 is equal to or substantially the same as the bandgap of $Al_{0.2}Ga_{0.8}As$, i.e., transparent to the designed wavelength of operation of device 30. With the exchange of an AlGaAs grating layer 24 with an InGaAsP grating layer 44, the fundamental operation of device 30 remains basically unchanged from its predecessor DBR laser diode.

DFB laser diode 30 comprises a substrate 32 of n-GaAs upon which is consecutively deposited in a first MOCVD growth process, waveguide layer 34 of n-AlGaAs, cladding layer 36 of n-AlGaAs, active region 38 comprising GaAs or multiple quantum wells of GaAs separated by AlGaAs barriers or quantum wells of AlGaAs separated by barrier of AlGaAs, a cladding layer 40 of p-AlGaAs, spacer layer 42 of p-AlGaAs, and grating layer 44 of InGaAsP having a periodic grating 45 formed in layer 44 by selective etching using conventional photolithography and etching techniques. The InGaAsP grating layer 44 is tailored to have a bandgap similar to a high Al content AlGaAs layer, such as between about 20% to 40%, to achieve transparency and to be also lattice matched to the AlGaAs/GaAs structure. Upon the completion of the deposition of Al-free layer 44, the wafer must, then, be removed from the MOCVD reactor to accomplish the etching step for forming grating 45. Since layer 44 is free of any Al content, there is no chance of forming strong oxides on it surface when exposed to the atmospheric environment and, as contemplated in York et al., supra, there is no necessity of using wet chemical etches to remove surface oxides. After formation of grating 45, a second MOCVD growth process is commenced with the deposit of waveguide layer 46 of p-AlGaAs followed by cap layer 48 of $p^+$-GaAs.

In applications where the DFB grating structure is weak, i.e., is wavelength stabilizing but not necessarily operating in single longitudinal mode (i.e., multiple mode operation), the grating layer is kept sufficiently thin, e.g., below about 1,000 Å and fairly remote from the active region, and impurity induced disordering can be employed to form light propagating waveguides in the DFB/active region structure.

FIG. 3 illustrates a more specific and detail embodiment of this invention comprising DFB laser device 50. Laser 50 comprises a substrate 52 of n-GaAs upon which is deposited a buffer layer 54 of n-GaAs followed by cladding layer 56 of $Al_{0.55}Ga_{0.45}As$, an active region 78 of double quantum wells of $Al_{0.25}Ga_{0.75}As$ sandwiching a barrier layer of $Al_{0.55}Ga_{0.45}As$, a cladding layer 80 of p-$Al_{0.55}Ga_{0.45}As$ and a layer 60 of InGaAsP which is lattice matched to the AlGaAs active region 58. At this point, a diffraction grating is formed in layer 60, having a pattern, for example, as denoted in FIG. 2, using wet chemical etchant followed by the second growth process of high Al-content grating fill-in layer 62 of p-$Al_{0.85}Ga_{0.15}As$ followed by cladding layer 66 of p-$Al_{0.55}Ga_{0.45}As$ and cap layer 68 of $p^+$-GaAs. Also, InGaP may use as the grating fill-in layer 62. Grating layer 62 is comparatively thin, such as 0.1 $\mu$m or less. Broad area laser diodes may be formed from GaAs wafers with contiguous layers, of the type noted above, having 100 $\mu$m wide stripes and 750 $\mu$m long optical cavities operating at room temperature with uniform slope efficiency of 0.8 W/A and having a current threshold density around 500 A/$cm^2$ with a narrow linewidth wavelength of approximately 813 nm.

Reference is now made to another embodiment, shown in FIG. 4, utilizing the InGaP/InGaAsP/GaAs material regime. The AlGaAs regime with compressively strained quantum wells is limited to emission wavelengths longer than about 0.9 $\mu$m. To achieve a compressively strained quantum well at an emission wavelength of 810 nm or less requires the use of quaternary InGaAsP materials. In FIG. 4, DFB laser 70 comprises a substrate 72 of n-GaAs upon which is consecutively deposited buffer layer 74 of n-GaAs, a cladding layer 76 of n-$In_{0.5}(Ga_{0.5}Al_{0.5})_{0.5}P$, an active region 78 of multiple, compressively strained quantum wells of InGaAsP and barrier layers of InGaP, a cladding layer 80 of p-$In_{0.5}(Ga_{0.5}Al_{0.5})_{0.5}P$ and a ternary grating layer 62 of $In_{0.5}Ga_{0.5}P$. Ternary grating layer 62 is more amenable to lattice matching and is transparent to shorter wavelengths of operation, e.g., below 800 nm. The diffraction grating is formed in layer 82 using wet chemical etchant followed by the second growth process of high Al-content, grating fill-in ternary layer 84 of p-$In_{0.5}Al_{0.5}P$, which is easily grown defect-free on InGaP grating layer 62, followed by cladding layer 86 of p-$In_{0.5}(Ga_{0.5}Al_{0.5})_{0.5}P$ and cap layer 88 of $p^+$-GaAs. Broad area laser diodes may be formed from GaAs wafers with contiguous layers, noted above, having 100 $\mu$m wide stripes and 1 mm uncoated, long optical cavities operating at room temperature with uniform slope efficiency of 0.8 W/A and having a current threshold density around 290 A/$cm^2$ with a narrow linewidth wavelength of approximately 760 nm.

While it is recognized that the use of Al-free grating layers 44, 60 or 82 eliminate the problem of oxidation, it is known that Al-free laser diodes, such as InGaAsP/InP material regime lasers, are more temperature sensitive than AlGaAs because of electron leakage brought about by lower barrier heights. As a result, it may be more desirable to utilize the Al-containing laser diodes of FIGS. 2 and 3 rather than the Al-free laser diode of FIG. 4, that is, a DBR device with an AlGaAs active region in combination with an InGaAsP grating layer. In either case, however, the temperature sensitivity can be addressed by reducing the temperature sensitivity of the DBR laser diode by widening the gain bandwidth of the laser active region. Conventional DBR laser diodes generally employ double quantum well active regions which have a gain bandwidth of 20 nm to 25 nm and, as such, have an operating temperature range of about 40° C. to 50° C., i.e., a temperature range of about 10° C. The quantum well gain peak moves with temperature at a rate of about 0.5 nm/° C. The grating wavelength moves with temperature at a rate of about 0.07 nm/° C. In the design of the DBR laser device, the optimum operating temperature is achieved when the gain peak of the active region is aligned with the wavelength peak of the grating. However, at a lower or higher operating temperature, the wavelength peak will become offset from the gain peak of the active region. If the operating temperature becomes sufficiently too low or too high, the grating wavelength, which determines the operating wavelength of the laser, will move out of the gain bandwidth or spectrum of the quantum well active region, terminating lasing operation. Thus, with lasing wavelength controlled by the inclusion of grating feedback, the laser diode device becomes susceptible to performance collapse at extremes of the operating temperature range unless steps are taken to ensure there is adequate bandwidth gain at the grating wavelength at all operating temperatures. This can be accomplished by extending the gain bandwidth of the laser.

To extend the temperature range, such as to about 125° C., which would require an active region gain bandwidth of 50 nm. The active region of laser diode devices 30, 50 or 70 can be extended by means of employing a multiple quantum well active region with each quantum well has a different bandgap energy. With additional wells, the gain spectra is increased as well as providing a gain bandwidth that is extended and flattened over the band. Although the gain spectrum will change with temperature, there is always sufficient gain for efficient operation at all operating temperatures.

The spectra can be increased by using additional quantum wells beyond double quantum wells and the gain bandwidth can be extended by employing quantum wells of different material composition or wells of varying well width as illustrated, respectively, in FIGS. 5 and 6. As shown in FIG. 5, quantum wells 96A–96D are bounded by barrier layers 94 and confinement layers 92 and are separated by barriers 98 with substantially the same well widths but with wells of different composition. For example, wells 96A–96D may all be AlGaAs with different Al mole fractions separated by a few percent or more, all below the Al content of barriers 98. On the other hand, as shown in FIG. 6, quantum wells 106A–106D are bounded by barrier layers 104 and confinement layers 102 and are separated by barriers 108 with substantially the same material composition but with different well widths, such differing by several tens of Angstroms. Alternatively, the combination of different material composition in the quantum wells in combination with different well widths may be utilized to extend the gain bandwidth of the active region to twice the full-width-half-maximum (FWHM) to two times or more over that of double quantum well DBR laser diodes.

Thus, a temperature insensitive, high power DFB or DBR laser diode or diode array, for example, operating at around 810 nm, provides for good performance through replacement of Al-containing diffraction grating layers with an Al-free diffraction grating layer, e.g., InGaAsP or InGaP, providing for lower defects, in combination with a modified QW active region with multiple quantum wells in the structure that provides for wider gain bandwidth over a wider temperature range of operation in that the wavelength peak of the grating more assuredly remains within the wavelength operating range of the device over the wider temperature range.

Although the invention has been described in conjunction with one or more preferred embodiments, it will be apparent to those skilled in the art that other alternatives, variations and modifications will be apparent in light of the foregoing description as being within the spirit and scope of the invention. Thus, the invention described herein is intended to embrace all such alternatives, variations and modifications that are within the spirit and scope of the following claims.

What is claimed is:

1. An optical semiconductor device comprising:

a plurality of layers of III-V compound semiconductor material including an active region between first and second cladding layers for guiding a propagating mode along said active region;

at least one of said layers formed comprising an Al-containing, III-V compound;

a diffraction grating formed in said device sufficiently close to said active region to interact with at least a portion of said propagating mode;

said grating formed in or at the boundary of a layer of Al-free III-V material.

2. The optical semiconductor device of claim 1 wherein said grating layer comprises InGaAsP or InGaP.

3. The optical semiconductor device of claim 2 wherein said active region contains at least one layer having Al.

4. The optical semiconductor device of claim 3 wherein said device is a DFB laser, DBR laser or an optical filter.

5. The optical semiconductor device of claim 2 wherein said cladding layers contain Al.

6. The optical semiconductor device of claim 5 wherein said device is a DFB laser, DBR laser or an optical filter.

7. The optical semiconductor device of claim 1 wherein said grating periodic or chirped.

8. The optical semiconductor device of claim 1 wherein said device has an active region containing AlGaAs and said grating comprises InGaAsP lattice matched to said active region.

9. The optical semiconductor device of claim 1 wherein said device has an active region containing InGaAsP and said grating comprises InGaP lattice matched to said active region.

10. The optical semiconductor device of claim 9 wherein said cladding layers contain Al.

11. The optical semiconductor device of claim 10 wherein said cladding layers comprise InGaAlP.

12. The optical semiconductor device of claim 1 wherein said active region comprises a plurality of quantum well layers separated by barrier layers, means provided in said quantum well layers to extend gain bandwidth operation of the device to insure continued operation thereof over a wider temperature range that includes the wavelength peak of said diffraction grating.

13. The optical semiconductor device of claim 12 wherein said quantum well layer means comprises a plurality of quantum wells having different mole fraction compositions of semiconductor material.

14. The optical semiconductor device of claim 12 wherein said quantum well layer means comprises a plurality of quantum wells having different well widths.

15. The optical semiconductor device of claim 12 wherein said quantum well layer means comprises a plurality of quantum wells having, in combination, wells with different mole fraction compositions of semiconductor material and different well widths.

16. An optical semiconductor device comprising:

a plurality of layers of III-V compound semiconductor material including a quantum well active region between first and second cladding layers for guiding a propagating mode along said active region, said quantum well active region having a plurality of quantum wells;

said active region comprising a plurality of quantum well layers separated by barrier layers;

a diffraction grating formed in said device sufficiently close to said active region to interact with at least a portion of said propagating mode, said diffraction grating having a peak wavelength causing said device to substantially operate at the grating peak wavelength; and means provided in at least some of said active region quantum wells to cause said quantum wells to have different bandgap energies to extend the gain bandwidth operation of the device to provide temperature insensitive operation over a wider temperature range that includes the wavelength peak of said diffraction grating.

17. The optical semiconductor device of claim 16 wherein said grating comprises a layer of Al-free III-V material.

18. The optical semiconductor device of claim 17 wherein said grating layer comprises InGaAsP or InGaP.

19. The optical semiconductor device of claim 18 wherein said active region contains at least one layer having Al.

20. The optical semiconductor device of claim 19 wherein said device is a DFB laser, DBR laser or an optical filter.

21. The optical semiconductor device of claim 18 wherein said cladding layers contain Al.

22. The optical semiconductor device of claim 21 wherein said device is a DFB laser, DBR laser or an optical filter.

23. The optical semiconductor device of claim 16 wherein said grating is a periodic grating or a chirped grating.

24. The optical semiconductor device of claim 16 wherein said device is a DFB laser, DBR laser or an optical filter.

25. The optical semiconductor device of claim 16 wherein said quantum well means comprises quantum wells having different material composition from one another.

26. The optical semiconductor device of claim 16 wherein said quantum well means comprises quantum wells having different well widths.

* * * * *